United States Patent [19]

Ueda et al.

[11] Patent Number: 5,800,966
[45] Date of Patent: Sep. 1, 1998

[54] POSITIVE PHOTORESIST COMPOSITION

[75] Inventors: Yuji Ueda, Izumi; Naoki Takeyama, Settsu; Hiromi Ueki, Osaka; Takehiro Kusumoto, Takarazuki, all of Japan

[73] Assignee: Sumitomo Chemical Company, Limited, Osaka, Japan

[21] Appl. No.: 44,487

[22] Filed: Apr. 9, 1993

[30] Foreign Application Priority Data

Apr. 10, 1992 [JP] Japan ................................. 4-090771
Jan. 18, 1993 [JP] Japan ................................. 5-005793

[51] Int. Cl.$^6$ ................................. G03C 1/725
[52] U.S. Cl. ................................. 430/283.1; 430/270.1; 430/281.1; 430/326
[58] Field of Search ................................. 430/283, 326, 430/281, 270, 270.1, 281.1, 283.1

[56] References Cited

U.S. PATENT DOCUMENTS 4,371,605  2/1983  Renner ................................. 430/280

FOREIGN PATENT DOCUMENTS

| 388343 | 9/1990 | European Pat. Off. . |
| 388343A3 | 8/1991 | European Pat. Off. . |
| 0460416 | 12/1991 | European Pat. Off. . |
| 497342A3 | 9/1992 | European Pat. Off. . |
| 9115808 | 10/1991 | WIPO . |

OTHER PUBLICATIONS

Solid State Technology, Aug. 1991, Chemically Amplified Resists Lamola, et al, No. 8 Westford, MA US Aug. 1991. 8226, Ocrpe:Ectrpmoc Emgomeeromg 14(1991) Sep., No. ¾, Amsterdam, NL *Highly sensitive positive deep–UV resist* . . . , Leo Schlegel et al.

The Japan Society of Applied Physics and Relaed Societies, The 38th Spring Meeting, 1991, (29a–ZC–7).

The Japan Society of Applied Physics and Related Societies, The 38th Spring Meeting, 1991, (30a–ZA–3).

*Primary Examiner*—Mark Chapman
*Attorney, Agent, or Firm*—Birch, Stewart, Kolasch & Birch, LLP

[57] ABSTRACT

This invention provides a positive photoresist composition comprising an alkali-soluble resin, a dissolution inhibitor and a photo-induced acid precursor, wherein said alkali-soluble resin is obtainable through a condensation reaction of a compound represented by the general formula (I):

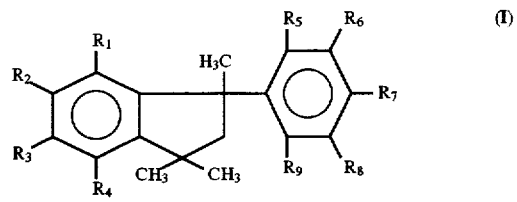

wherein $R_1$ to $R_9$ each represent hydrogen atom, halogen atom, alkyl group, alkenyl group, —OH group or the like, provided that at least one of $R_1$ to $R_9$ is —OH group and at least two hydrogen atoms are attached to the o- or p-position of the —OH group, and an aldehyde. This positive photoresist composition is excellent in performances such as resolution, profile, sensitivity, etc.

13 Claims, No Drawings

POSITIVE PHOTORESIST COMPOSITION

BACKGROUND OF THE INVENTION

1. Field of the Invention

This invention relates to a chemically amplified positive photoresist composition.

2. Related Art

Due to the recent improvement in the degree of integration of integrated circuits (64 or 256 MDRAM), today's photoresists are requested to have an ability to form submicron patterns. Thus, development of a positive type photoresist suitable for use in the far ultraviolet lithography such as those using excimer laser or the like as a light source is a particularly urgent demand of the time, and a chemically amplified positive photoresist comprising an alkali-soluble resin, a dissolution inhibitor and a photo-induced acid precursor is watched with interest. The function of this type of photoresist consists in transforming a dissolution inhibitor to a dissolution promotor by utilizing the acid generated upon exposure to light and baking, and thereby enhancing the dissolution velocity ratio between the unexposed area and exposed area of alkali-soluble resin to improve the resolution. For example, the Extended Abstracts (the 38th Spring Meeting, 1991); the Japan Society of Applied Physics and Related Societies (29a-ZC-7) mentions the influence on the resolution of a chemically amplified positive photo-resist composition comprising a resin prepared by partially replacing the —OH groups of polyvinylphenol with an acid removable protecting group, a dissolution inhibitor and a photo-induced acid precursor when the composition is exposed to a deep ultraviolet ray. In the paper, it is mentioned that the resin became insoluble in developing solution when the degree of replacement was elevated to 20% or above, that a ternary resist containing a dissolution inhibitor was higher than a binary resist containing no dissolution inhibitor in the dissolution velocity ratio at the time of development, and that a patterning evaluation of the ternary resist using an excimer laser stepper showed that a 0.35 μm line-and-space could be resolved (FIG. 1).

In the Extended Abstracts (the 38th Spring Meeting, 1991); the Japan Society of Applied Physics and Related Societies (30a-ZA-3), it is mentioned that a chemically amplified positive photoresist composition comprising a novolac resin, a dissolution inhibitor having t-butoxycarbonyloxy group and a nonmetallic onium salt was applied to electron beam lithography. It is also mentioned that as the onium salt of this ternary system, triphenylsulfonium triflate was undesirable but bis(t-butylphenyl)-iodonium triflate (a) exhibited an excellent property. Further, it is also mentioned that the property of this resist system varied depending on the kind of the dissolution inhibitor having t-butoxycarbonyloxy group in such a manner that polymeric t-butoxycarbonyl compounds were not good in profile (overhanging patterns) though it exhibited an excellent dissolution inhibition. It is also mentioned that, among the dissolution inhibitors of this class, $[t-C_4H_9OCO—O—C_4H4]_2.C(CH_3)_2$ (b) was best in sensitivity and resolution. It is also mentioned that tentative resists containing the above-mentioned (a) and (b), respectively, resolved a 0.15 μm line-and-space pattern having a thickness of 0.47 μm with an exposure dose of 14 μC/cm² in electron beam lithography (FIG. 1), and that the tentative resists were useful for X ray lithography, too, and could resolve 0.2 μm contact holes in a thickness of 1.3 μm.

In claim 1 of EP-A-0 388343, there is mentioned a resist for use in photon, electron beam and X-ray exposure devices comprising (A) a polymeric or molecular composition the solubility of which is dependent upon the presence of acid removable protecting groups and (B) a polymeric or molecular composition having a sulfonic acid precursor which generates a strong acid upon exposure to such radiation. In Example 5 of the specification, for example, a resist composition for use in a 240–260 nm exposing device comprising MDT (a kind of a photo-induced acid precursor), a novolac resin and $[p-t-C_4H_9OCO—O—C_6H_4)_2].C(CH_3)_2$ (dissolution inhibitor) is mentioned.

However, the photoresist compositions mentioned above are yet unsatisfactory in resolution, profile and sensitivity.

SUMMARY OF THE INVENTION

This invention provides a positive photoresist composition excellent in performances such as resolution, profile, sensitivity, etc.

This invention relates to a positive photo-resist composition comprising an alkali-soluble resin, a dissolution inhibitor and a photo-induced acid precursor wherein said alkali-soluble resin is obtainable through a condensation reaction of phenol compound including a compound represented by the general formula (I):

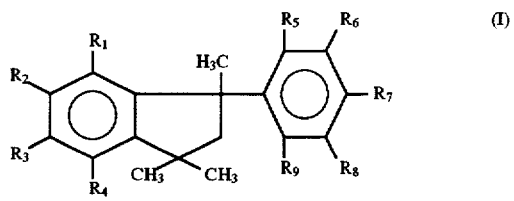

wherein $R_1$ to $R_9$ independently of one another each represent a hydrogen atom, a halogen atom, an optionally substituted straight chain or branched chain alkyl or alkenyl group, a —OH group or an optionally substituted alkylcarbonyl group, provided that at least one of $R_1$ to $R_9$ is —OH group and at least two hydrogen atoms are attached to the o- or p-position of said —OH group, and an aldehyde compound.

DETAILED DESCRIPTION OF THE INVENTION

Next, this invention will be explained below in detail.

As the alkyl, alkenyl or alkylcarbonyl group represented by $R_1$ to $R_9$, those having 5 or less carbon atoms are preferable. As the substituent on said alkyl, alkenyl or alkylcarbonyl group, halogen atom, —OH group, —SH group, phenyl group, lower alkylthio group and the like can be referred to. As $R_1$ to $R_9$, hydrogen atom and alkyl group are preferable, and hydrogen atom, methyl group and ethyl group are more preferable.

Preferable examples of the compound (I) can be referred a compound in which at least one of $R_1$ to $R_4$ is —OH group, and at least one of $R_5$ to $R_9$ is —OH group.

Specific examples of the compound represented by the general formula (I) include the following:

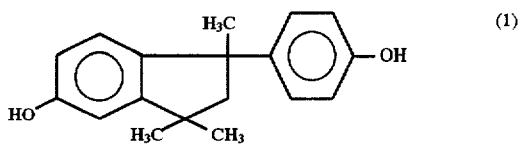

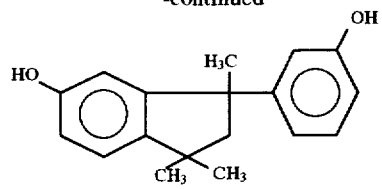  (2)

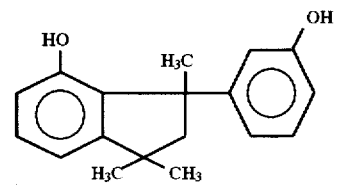  (3)

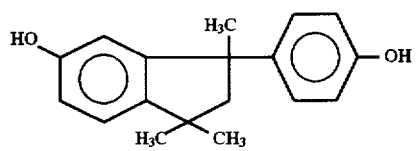  (4)

The compounds represented by the general formula (I) can be produced according to the method mentioned in U.S. Pat. No. 3,288,864, etc. by using, for example, m- or p-isopropenylphenol or linear dimers thereof.

As the phenol compound other than the compound represented by the general formula (I), for example, the following can be referred to: phenol, o-, m- or p-cresol, o-, m- or p-ethylphenol, 2-, 3- or 4-isopropyl-phenol, o- or p-sec-butylphenol, o-, m- or p-tert-butylphenol, 2,5-, 3,5- or 3,4-xylenol, 2,3,5-trimethylphenol, 5-methyl-2-tert-butylphenol, m-methoxyphenol, isoamylphenol, resorcin, 2-methyl-resorcin, hydroquinone, 2,2-bis(4-hydroxyphenyl)-propane, 2-naphthol, 1,3-, 1,7- or 1,5-dihydroxy-naphthalene and the like.

These-phenol compounds are used either singly or in the form of a mixture of two or more members.

The alkali-soluble resin is obtainable through a condensation reaction of a phenol compound containing a compound represented by the general formula (I), and an aldehyde compound in the presence of an acid catalyst. The condensation reaction is carried out in the usual manner either in bulk phase or in a solvent, usually at 60°–120° C. for 2–30 hours.

Examples of the aldehyde compound include formaldehyde, paraformaldehyde, acetaldehyde, propyl aldehyde, benzaldehyde, phenylacetaldehyde, α-phenylpropyl aldehyde, β-phenylpropyl aldehyde, o-, m- or p-hydroxybenzaldehyde, glutaraldehyde, glyoxal, o-methylbenzaldehyde, p-methylbenzaldehyde and the like. Among these aldehyde compounds, formaldehyde is preferable because it is readily available industrially. These aldehyde compounds are used either singly or in the form of a mixture of two or more members. As examples of the acid catalyst, inorganic acids such as hydrochloric acid, sulfuric acid, perchloric acid, phosphoric acid and the like, organic acids such as oxalic acid, trichloracetic acid, formic acid, p-toluenesulfonic acid and the like, and divalent metal salts such as zinc acetate, magnesium acetate and the like can be referred to. Examples of the solvent include toluene, xylene, ethyl cellosolve acetate, n-propyl alcohol, n-butyl alcohol, i-butyl alcohol, n-hexyl alcohol, dipropyl ether, dibutyl ether, diglyme, n-heptane, n-octane, methyl isobutyl ketone and the like.

The molecular weight of the alkali-soluble resin is usually 2,000–50,000 and preferably 3,000–30,000, as expressed in terms of polystyrene-converted weight average molecular weight measured by the GPC method.

As the dissolution inhibitor, compounds having benzene ring substituted by t-butoxycarbonyloxy group and the like can be referred to. Preferable examples of said compound include monocyclic and bicyclic compounds such as:

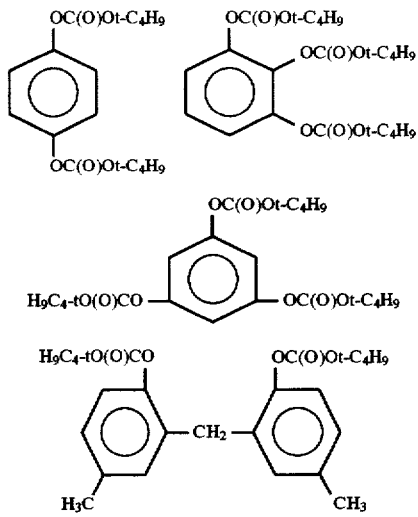

or the compounds represented by the following general formula (II):

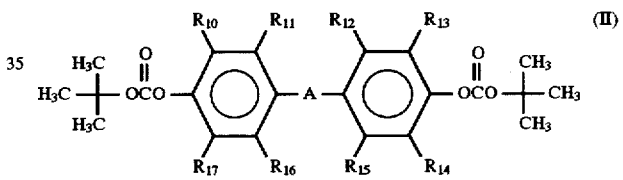  (II)

wherein $R_{10}$ to $R_{17}$ independently of one another each represent a hydrogen atom, a halogen atom, an optionally substituted straight chain or branched chain alkyl or alkenyl group or an optionally substituted alkylcarbonyl group, and A represents —O—, —SO$_2$— or optionally substituted alkylene group having 1–6 carbon atoms, and the like. Among these compounds, the compounds represented by the general formula (II) are more preferable.

Examples of the compound represented by the general formula (II) include the following:

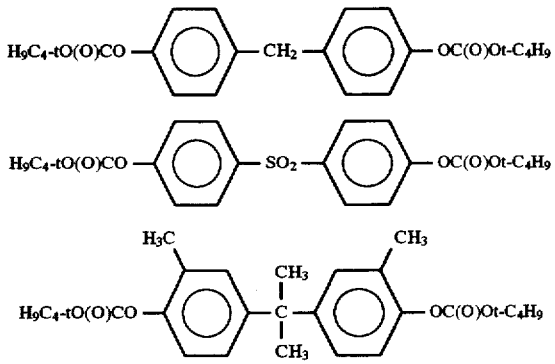

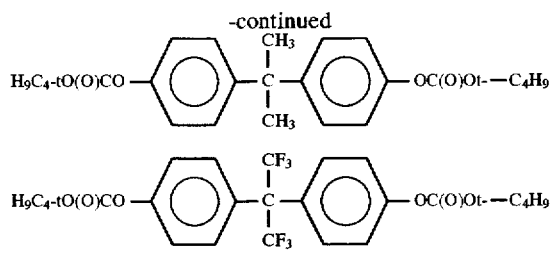

and the like.

The compound having benzene ring substituted by t-butoxycarbonyloxy group can be produced by reacting the corresponding compound having a benzene ring substituted by —OH group with di-t-butyl dicarbonate in the presence of a basic catalyst. As the basic catalyst, alkaline substances such as sodium hydroxide, potassium carbonate and the like are preferably used. These basic catalysts can be used either in the form of a solid material such as granule, powder and the like or in the form of a solution in water or organic solvent, and preferably in the form of a solid. When the basic catalysts are used in the form of an aqueous solution, the concentration is usually 10–50% by weight and preferably 20–30% by weight. The basic catalyst and di-t-butyl dicarbonate are used usually in an amount of 1.1–2.2 equivalents (preferably 1.2–1.8 equivalents) and 1.0–2.0 equivalents (preferably 1.0–1.6 equivalents), respectively, both per equivalent of the —OH group in the compound having benzene ring substituted by —OH group.

The above-mentioned reaction is usually carried out in the presence of an organic solvent. Examples of the solvents usable in this reaction include ethers such as tetrahydrofuran and the like, ketones such as acetone and the like, halogenated hydrocarbons such as chloroform and the like, and esters such as ethyl acetate and the like, among which ethers are preferable. The organic solvent is used usually in an amount of 1–10 parts by weight and preferably in an amount of 3–6 parts by weight per part by weight of the compound having benzene ring substituted by —OH group. In the reaction mentioned above, phase transfer catalysts such as (n-$C_4H_9$)$_4$NHSO$_4$, crown ethers (for example, 18-crown-6 and the like), etc. can also be used, and the amount of the phase transfer catalyst may be decided appropriately.

The reaction temperature is usually 10°–50° C. and preferably 15°–30° C. The end point of the reaction is determined by detecting the time when the compound having benzene ring substituted by —OH group has disappeared by means of gas-, liquid- or thin layer-chromatography, for example.

The photo-induced acid precursor is not critical, so far as it generates an acid upon exposure to radiations such as far ultraviolet ray and the like. Examples of the photo-induced acid precursor include the compounds mentioned in Japanese Patent Application KOKAI No. 62-164045, No. 63-153542, No. 53-133428, F.C. Schaefer et al. J. Org. Chem., 29, 1527 (1964), Bull. Chem. Soc. Japan, 42, 2924 (1969) and U.S. Pat. No. 3,987,037; the halogenated triazines mentioned in UK Patent 1388492; the trifluoromethanesulfonic acid esters represented by the following formulas:

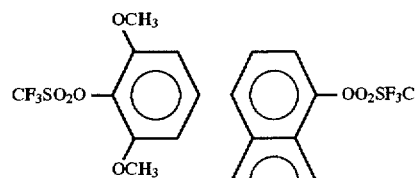
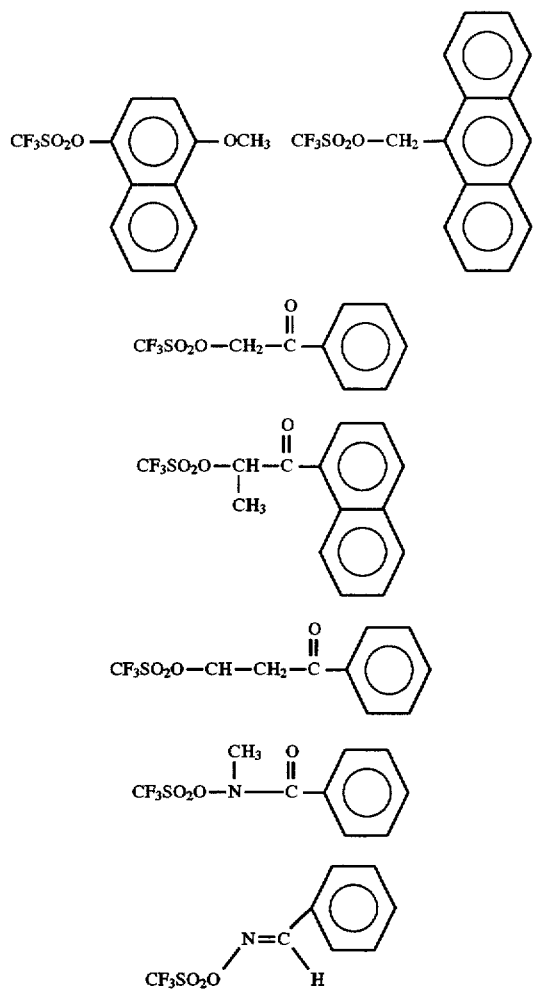

and the like; the arylsulfonylacetophenones represented by the following formulas:

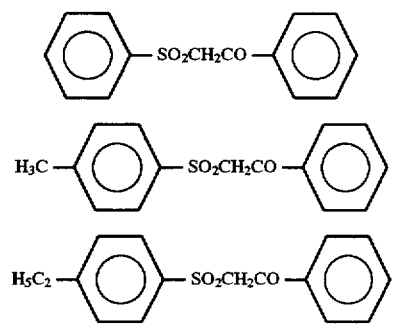

-continued

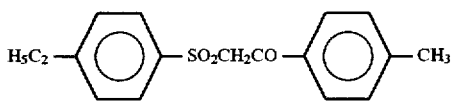

and the like; the disulfone compounds represented by the following formulas:

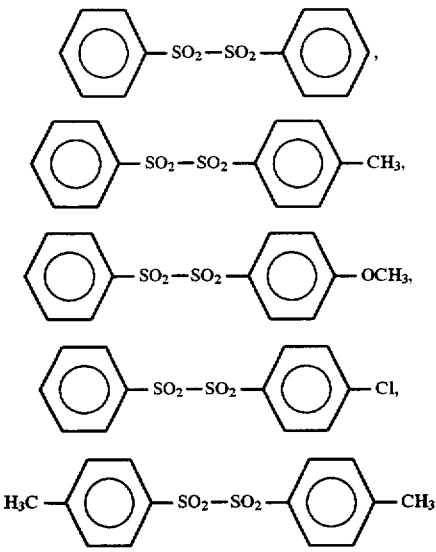

and the like; and the onium salts represented by the following formulas:

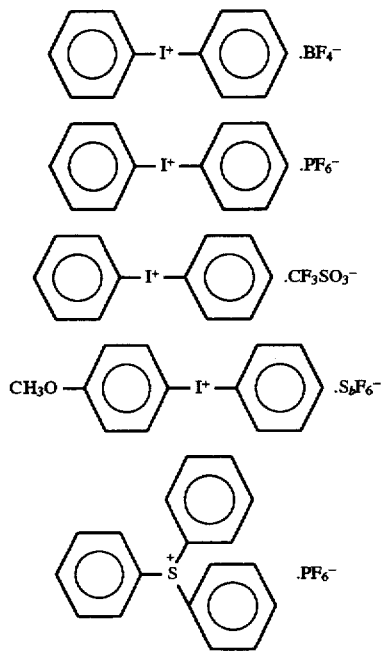

-continued

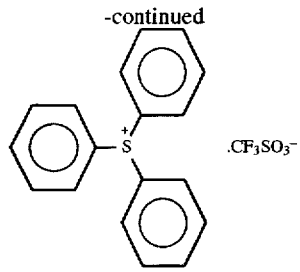

The photo-induced acid precursors usable further include sulfonic acid esters of N-hydroxyimide compounds represented by the following general formula (III):

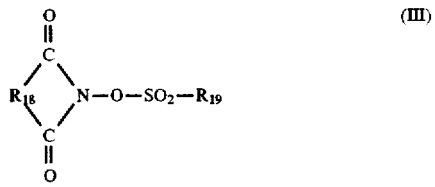

(III)

wherein $R_{18}$ represents an optionally substituted arylene, alkylene or alkenylene group and $R_{19}$ represents an optionally substituted alkyl or aryl group; and the esters represented by the following general formula (IV):

(IV)

wherein $R_{20}$ represents an optionally substituted alkyl or aryl group and n represents an integer of 1-3.

The arylene group represented by $R_{18}$ in the general formula (III) includes monocyclic and bicyclic arylene groups, among which phenylene, naphthylene and the like are preferable. Preferable substituents on the arylene group are halogen atom, nitro group, acetylamino group and the like.

The alkylene group represented by $R_{18}$ includes straight chain and branched chain alkylene groups, among which those having 1-6 carbon atoms are preferable. Particularly preferable alkylene groups are ethylene group, propylene group and the like. Preferable substituents on the alkylene group are halogen atom, lower alkoxy group, monocyclic aryl groups and the like.

The alkenylene group represented by $R_{18}$ includes those having 2-4 carbon atoms, among which vinylidene group and the like are preferable. Preferable substituents on the alkenylene group are monocyclic aryl groups and the like.

The alkyl group represented by $R_{19}$ includes straight chain, branched chain and cyclic alkyl groups, among which straight chain alkyl groups having 1-8 carbon atoms are preferable. Preferable substituents on the alkyl group are halogen atom, lower alkoxy group and the like.

The aryl group represented by $R_{19}$ includes monocyclic and bicyclic aryl groups, among which monocyclic aryl groups are preferable and phenyl group and the like are particularly preferable. Preferable substituents on the aryl group are lower alkyl groups, lower alkoxy groups, halogen atoms and the like.

Preferable examples of the sulfonic acid ester of N-hydroxyimide compound represented by the general formula (III) include the following:

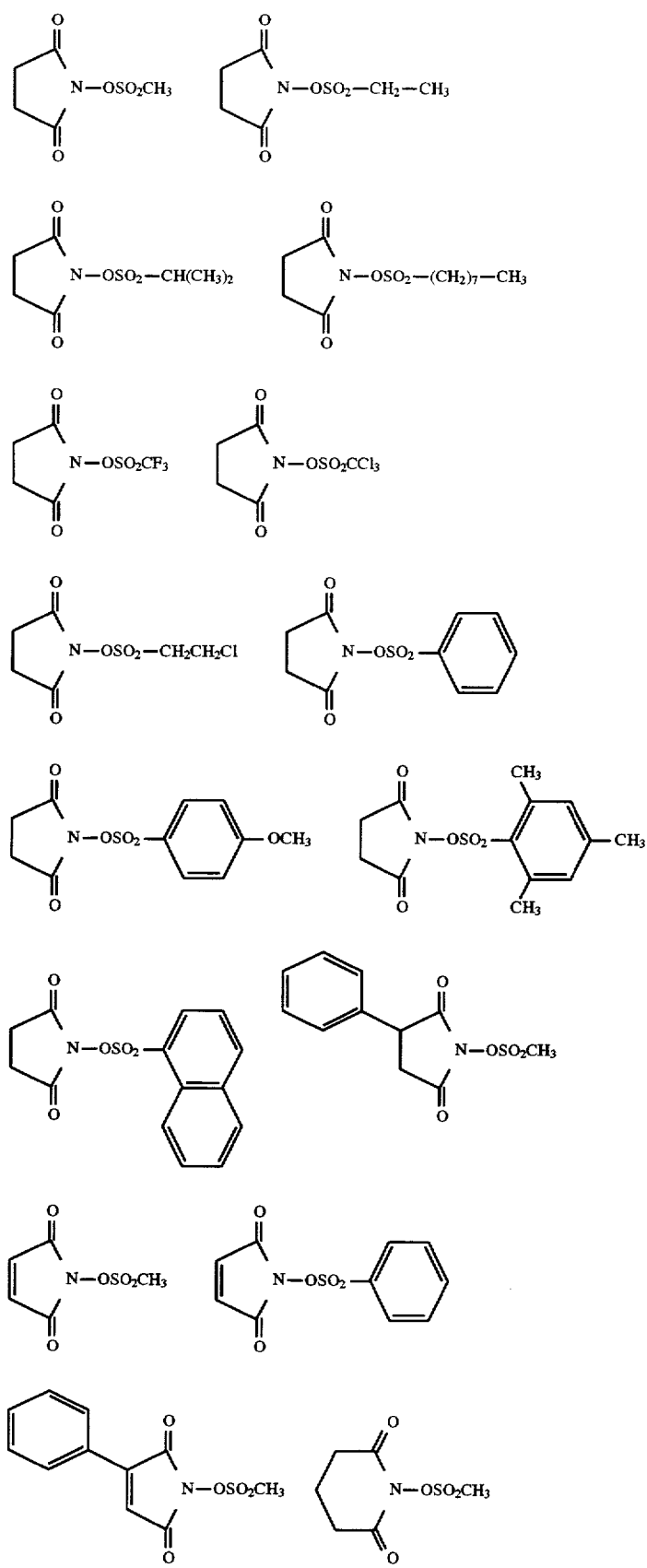

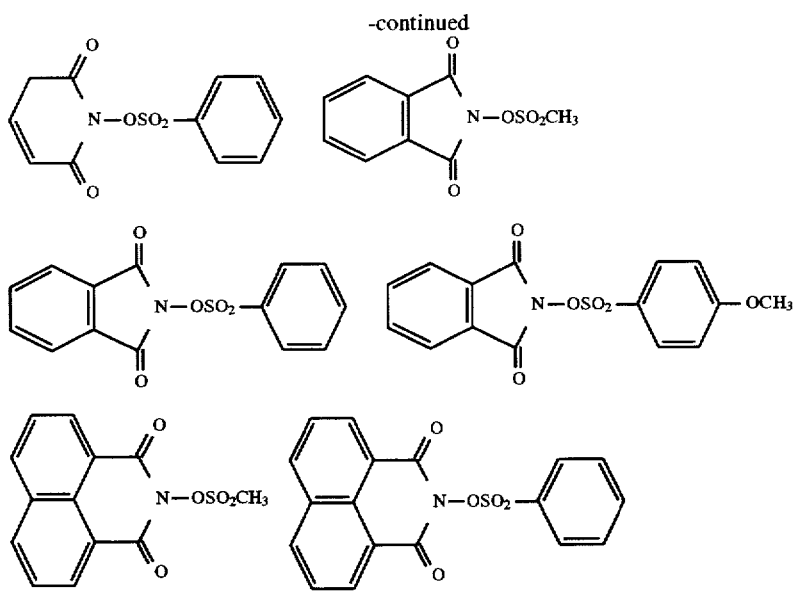

Examples of the ester represented by the general formula (IV) include the following:

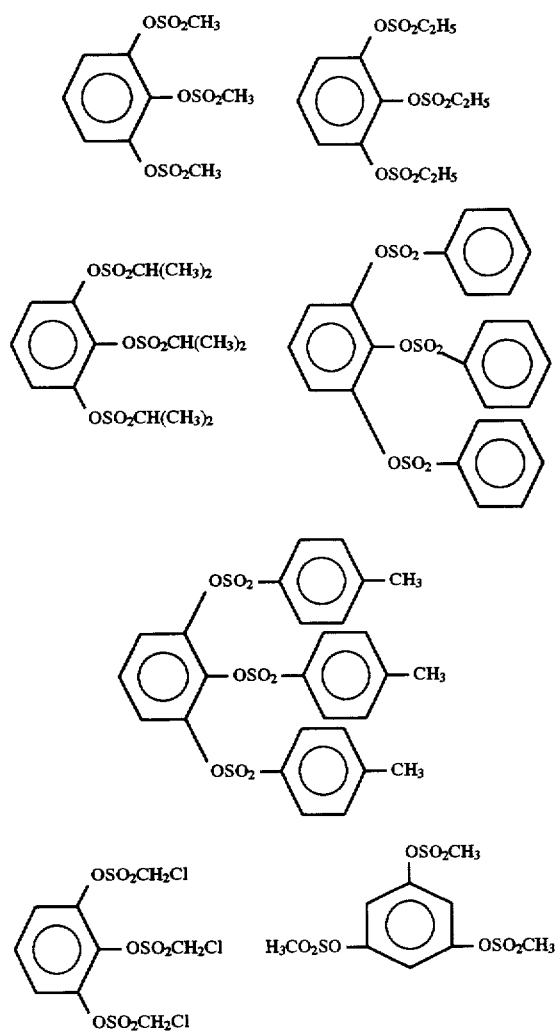

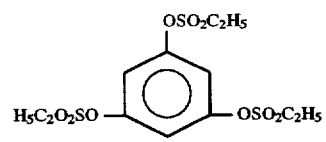

and the like.

Among the photo-induced acid precursors detailed above, the sulfonic acid esters of N-hydroxyimide compounds represented by the general formula (III) and the esters represented by the general formula (IV) are particularly preferable.

The component ratio of the positive photo-resist composition of this invention is usually as follows: alkali-soluble resin 20–90% by weight, dissolution inhibitor 5–50% by weight, photo-induced acid precursor 0.1–20% by weight; and preferably as follows: alkali-soluble resin 50–80% by weight, dissolution inhibitor 15–40% by weight, photo-induced acid precursor 1–10% by weight. Into the positive photoresist composition of this invention, various additives conventionally used in this field of the art such as a sensitizer, a dye, an adhesion improver and the like may be added, if desired.

A positive photoresist solution is generally prepared by mixing an alkali-soluble resin, a dissolution inhibitor, a photo-induced acid precursor and the like with a solvent so that concentration of the mixed materials in the resulting positive photoresist solution comes to 1–50% by weight. Examples of the solvent include ethyl cellosolve acetate, methyl cellosolve acetate, ethyl cellosolve, methyl cellosolve, propylene glycol monomethyl ether acetate, propylene glycol monoethyl ether acetate, diethylene glycol dimethyl ether, butyl acetate, ethyl lactate, ethyl pyruvate, methyl isobutyl ketone, 2-heptanone, xylene and the like. These solvents are used either singly or in the form of a mixture of two or more members.

Next, this invention will be concretely explained by referring to the following examples.

Synthesis Example 1

To a mixture of 100 g (0.37 mole) of the compound represented by the above-mentioned formula (4) (p-OST cyclic dimer, manufactured by Mitsui Toatsu Chemicals, Inc.), 100 g of methyl isobutyl ketone, 13.6 g (0.0074 mole) of 5% aqueous solution of oxalic acid and 30 g (0.37 mole) of acetic acid was dropwise added 30.18 g (0.37 mole) of 37% formalin at 80° C. over a period of one hour. After completing the dropping, the mixture was reacted at 95°–100° C. for 20 hours. The reaction mixture was cooled to 60° C. or below, 100 ml of deionized water was added thereto, and the whole was stirred and then left to stand. After separating the mixture into two liquid layers, the oily layer was several times washed with each 100 ml portion of deionized water, the methyl isobutyl ketone was distilled off, and the residue was mixed into ethyl cellosolve acetate to prepare a resin solution having a solid concentration of 40% (Resin A). The resin thus obtained had a polystyrene-converted weight average molecular weight of 3,975 as measured by GPC.

SYNTHESIS EXAMPLE 2

(1) To a mixture of 12.61 g (0.1 mole) of pyrogallol and 50 g of tetrahydrofuran were added 67.66 g (0.31 mole) of di-t-butyl dicarbonate, 51.41 g (0.372 mole) of potassium carbonate and 0.1 g of crown ether (18-crown-6). After the addition, the resulting mixture was reacted at room temperature for 24 hours. The reaction mixture was filtered, and the filtrate thus obtained was concentrated. The residue was mixed into 500 g of ethyl acetate and several times washed with water. The washed organic layer was concentrated to obtain a compound represented by the following formula:

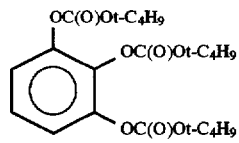

(2) The procedure of (1) was repeated, except that the pyrogallol was replaced with 22.8 g (0.1 mole) of Bisphenol A. Thus, a compound represented by the following formula:

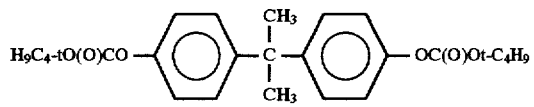

was obtained.

(3) The procedure of (1) was repeated, except that the pyrogallol was replaced with 25.0 g (0.1 mole) of 4,4'-dihydroxydiphenyl sulfone. Thus, a compound represented by the following formula:

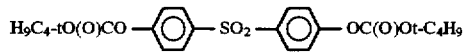

was obtained.

Example 1

In 39.2 parts by weight of ethyl cellosolve acetate were dissolved 53.8 parts by weight of the Resin A obtained in Synthesis Example 1, 5 parts by weight of the compound obtained in (1) of Synthesis Example 2 and 2.0 parts by weight of α-phenylsulfonylacetophenone. The resulting solution was filtered with a Teflon filter having a pore size of 0.2 μm to prepare a resist solution. A silicon wafer having been washed in the conventional manner was coated with the resist solution by the use of a spin coater up to a thickness of 0.7 μm. Subsequently, the wafer was pre-baked in an oven at 100° C. for one minute. Then, the coated film was exposed to far ultraviolet light through a patterned chromium mask by means of CANON Proximity Mask Aligner PLA-501F provided with CM-250 mirror. After the exposure to light, the wafer was heated on a hot plate at 120° C. for one minute. It was developed with 2.0% (by weight) aqueous solution of tetramethylammonium hydroxide to obtain a positive pattern. The sensitivity determined from a characteristic curve between an amount of exposure to light and film thickness retention was 40 mJ/cm$^2$ (exposure at 254 nm, at a film thickness retention of 0%). Observation of the formed pattern by means of an electron microscope revealed that 0.8 μm fine pattern could be resolved and the profile was good.

Example 2

Example 1 was repeated, except that the α-phenylsulfonylacetophenone was replaced with 2.0 parts by weight of diphenyl disulfone and the compound obtained in Synthesis Example 2 (1) was replaced with 5.0 parts by weight of the compound obtained in Synthesis Example 2 (2). A sensitivity of 13 mJ/cm$^2$ (254 nm) was obtained. A 0.8 μm fine pattern could be resolved, and the profile was good.

Example 3

Example 1 was repeated, except that the compound obtained in Synthesis Example 2 (1) was replaced with 5.0 parts by weight of the compound obtained in Synthesis Example 2 (3). A sensitivity of 7 mJ/cm$^2$(254 nm) was obtained. A 0.8 μm fine pattern could be resolved, and the profile was good.

Comparative Example 1

Example 2 was repeated, except that Resin A, the compound obtained in Synthesis Example 2 (2) and diphenyl disulfone were replaced with 21.52 parts by weight of polyvinyl phenol (MARUKA LYNCUR-M, manufactured by Maruzen Sekiyu), 5.0 parts by weight of a compound represented by the following formula:

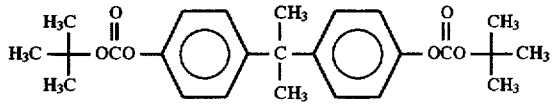

and 2.0 parts by weight of a compound represented by the following formula:

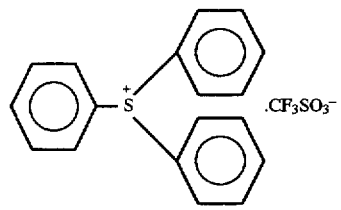

(6)

respectively. The sensitivity was 85 mJ/cm$^2$ (254 nm), and 0.8 μm pattern could not be formed.

Comparative Example 2

Comparative Example 1 was repeated, except that the polyvinylphenol (MARUKA LYNCUR-M, manufactured by Maruzen Sekiyu) was replaced with a modified product of said resin in which ¼, by number, of the phenolic —OH groups was converted to —OC(O)O—C(CH$_3$)$_3$. As the result, scum was noticeable after development, even though 0.8 μm pattern could be resolved.

Example 4

In 29.7 parts by weight of diethylene glycol dimethyl ether were dissolved 33.8 parts by weight of Resin A obtained in Synthesis Example 1, 3 parts by weight of the compound obtained in Synthesis Example 2 (2) and 1.5 parts by weight of pyrogallol trimesylate. The resulting solution was filtered with a Teflon filter having a pore size of 0.2 μm to prepare a resist solution. A silicon wafer having been washed in the conventional manner was coated with the resist solution by the use of a spin coater. Then, the wafer was pre-baked on a hot plate at 100° C. for one minute to adjust the film thickness to 0.7 μm. Then, the coated film was exposed to light through a patterned Reticle by means of a KrF Excimer Laser Stepper having an exposure wavelength of 248 nm (manufactured by Nicon, NSR-1755EX8, NA=0.45). After the exposure, the wafer was heated on a hot plate at 80° C. for 90 seconds, and then developed with 2.38% (by weight) aqueous solution of tetramethylammonium hydroxide to form a positive pattern. Observation of the pattern thus formed by means of an electron microscope revealed that a 0.35 μm line-and-space pattern was resolved at a sensitivity of 70 mJ/cm$^2$ and the profile was good.

Example 5

A positive pattern was formed by repeating Example 4, except that the pyrogallol trimesylate was replaced with ethanesulfonic acid triester of pyrogallol. Observation of the formed pattern by means of an electron microscope revealed that a 0.35 μm line-and-space pattern was resolved at a sensitivity of 120 mJ/cm$^2$ and the profile was good.

Example 6

A positive pattern was formed by repeating Example 4, except that the pyrogallol trimesylate was replaced with benzenesulfonic acid ester of N-hydroxy-succinimide. Observation of the formed pattern by means of an electron microscope revealed that a 0.40 μm line-and-space pattern was resolved at a sensitivity of 150 mJ/cm$^2$ and the profile was good.

Example 7

A positive pattern was formed by repeating Example 4, except that the pyrogallol trimesylate was replaced with isopropylsulfonic acid ester of N-hydroxysuccinimide. Observation of the formed pattern by means of an electron microscope revealed that a 0.50 μm line-and-space pattern was resolved at a sensitivity of 140 mJ/cm$^2$ and the profile was good.

What is claimed is:

1. A positive photoresist composition comprising an alkali-soluble resin, a dissolution inhibitor and a photo-induced acid precursor, wherein said alkali-soluble resin is obtainable through a condensation reaction of a phenol compound including a compound represented by the following general formula (I):

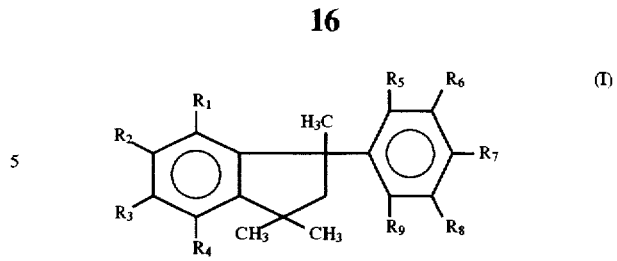

wherein R$_1$ to R$_9$ independently of one another each represent a hydrogen atom, a halogen atom, an optionally substituted straight chain or branched chain alkyl or alkenyl group, a —OH group or an optionally substituted alkylcarbonyl group, provided that at least one of R$_1$ to R$_9$ is —OH group and at least two hydrogen atoms are attached to the o- or p-position of the —OH group, and an aldehyde component.

2. A positive photoresist composition according to claim 1, wherein said dissolution inhibitor is a compound having a benzene ring substituted by t-butoxycarbonyloxy group.

3. A positive photoresist composition according to claim 2, wherein said compound having a benzene ring substituted by t-butoxycarbonyloxy group is a compound represented by the following general formula (II):

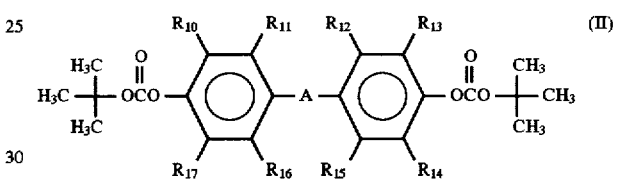

wherein R$_{10}$ to R$_{17}$ independently of one another each represent a hydrogen atom, a halogen atom, an optionally substituted straight chain or branched chain alkyl or alkenyl group or an optionally substituted alkylcarbonyl group; and A represents —O—, —SO$_2$— or optionally substituted alkylene group having 1–6 carbon atoms.

4. A positive photoresist composition according to claim 3, wherein the compound (I) is a compound such that at least one of R$_1$ to R$_4$ is a —OH group, and at least one of R$_5$ to R$_9$ is a —OH group.

5. A positive photoresist composition according to any one of claims 1–3, wherein said photo-induced acid precursor is a sulfonic acid ester of N-hydroxyimide compound represented by the following general formula (III):

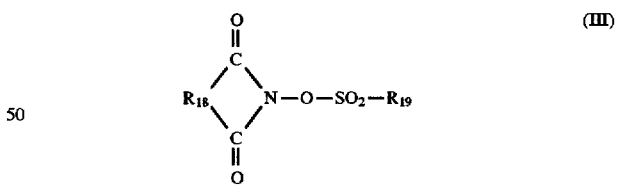

wherein R$_{18}$ represents optionally substituted arylene, alkylene or alkenylene group, and R$_{19}$ represents an optionally substituted alkyl or aryl group.

6. A positive photoresist composition according to any one of claims 1–3, wherein said photo-induced acid precursor is an ester represented by the following general formula (IV):

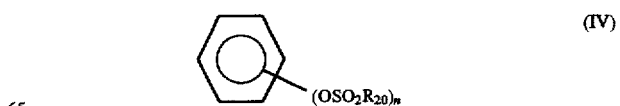

wherein R$_{20}$ represents an optionally substituted alkyl or aryl group, and n represents an integer of 1–3.

7. A positive photoresist composition according to claim 1, wherein the compound (I) is a compound such that at least one of $R_1$ to $R_4$ is a —OH group, and at least one of $R_5$ to $R_9$ is a —OH group.

8. A positive photoresist composition according to claim 1, wherein said alkali-soluble resin has a molecular weight of 2,000–50,000 expressed in terms of polystyrene-converted weight average molecular weight.

9. A positive photoresist composition according to claim 1, wherein said alkali-soluble resin has a molecular weight of 3,000–30,000 expressed in terms of polystyrene-converted weight average molecular weight.

10. A positive photoresist composition according to claim 1, wherein said dissolution inhibitor is selected from the group consisting of

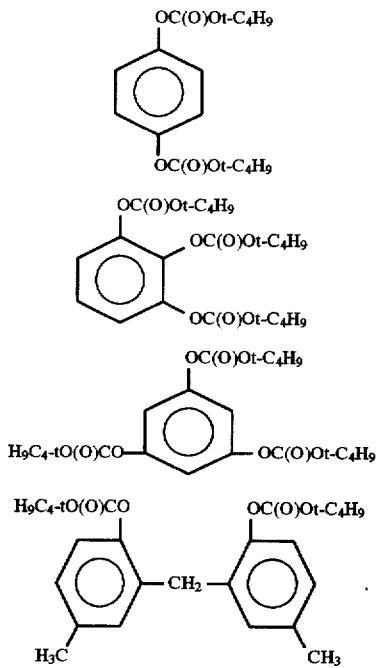

11. A positive photoresist composition according to claim 1, wherein said dissolution inhibitor is selected from the group consisting of

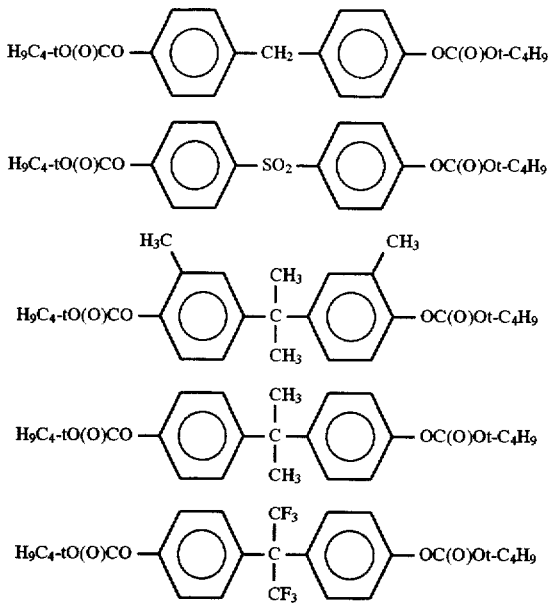

12. A positive photoresist composition according to claim 1, wherein said alkali-soluble resin is present in an amount of 20–90% by weight, said dissolution inhibitor is present in an amount of 5–50% by weight, and said photo-induced acid precursor is present in an amount of 0.1–20% by weight.

13. A positive photoresist composition according to claim 1, wherein said alkali-soluble resin is present in an amount of 50–80% by weight, said dissolution inhibitor is present in an amount of 15–40% by weight, and said photo-induced acid precursor is present in an amount of 1–10% by weight.

* * * * *